Oct. 12, 1965

J. W. SCHWARTZ
BRIDGE POWER AMPLIFIER WITH
LINEARIZING FEEDBACK MEANS
Filed Sept. 18, 1961

3,212,019

INVENTOR.
JAMES W. SCHWARTZ

BY Edward O. Ansell

ATTORNEY

United States Patent Office 3,212,019
Patented Oct. 12, 1965

3,212,019

BRIDGE POWER AMPLIFIER WITH LINEARIZING FEEDBACK MEANS

James W. Schwartz, Phoenix, Ariz., assignor to The Omega Electronics Corporation, Phoenix, Ariz., a corporation of Arizona Filed Sept. 18, 1961, Ser. No. 138,951
4 Claims. (Cl. 330—14)

Figure 1:
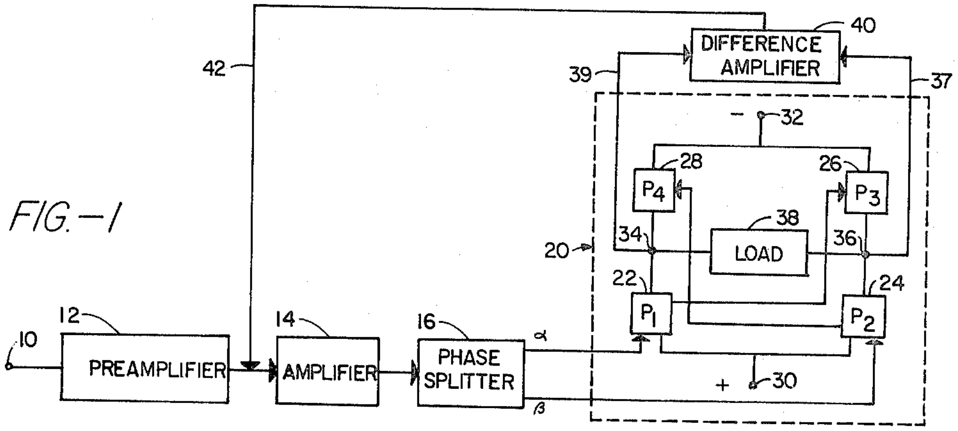

This invention relates generally to transistorized audio amplifier circuits, and to transistorized bridge output circuits for audio amplifiers in particular. In the construction and utilization of audio power amplifiers where high fidelity is of paramount concern, the double-ended or symmetrical output stage has found favor over the single-ended stage. This is because of its adaptability to highly efficient Class B operation and because of its tendency to cancel even harmonics generated within the stage, and thus provide a more faithful high power reproduction of the signal to be amplified. While use has been made of double-ended output stages utilizing output transformers, such circuits have the disadvantage of increased cost, weight and space requirements brought about by use of the transformer. Further, because of the predominantly inductive characteristic of transformers, the output stage will have a resonant characteristic at certain audio frequencies, and the objectionable phenomenon of "ringing" may occur. Because transistors are inherently low voltage, high current devices they may be closely matched to a low impedance load such as a loudspeaker without the use of a transformer.

A bridge configuration is particularly advantageous as a high power transistor audio amplifier because an inexpensive low voltage power supply may be used with inexpensive low voltage transistors to produce a peak-to-peak load voltage of almost twice the supply potential. In addition, power losses may be dissipated evenly in four power transistors rather than concentrated in only two power transistors, allowing higher power operation. Transistors offer numerous additional advantages over vacuum tubes. They permit construction of smaller sized and more economically operating units, generate much less heat, and eliminate microphonics. With transistors being used in the bridge output amplifier stage, however, it has previously been difficult to cause them to operate in a linear manner over the entire dynamic range and audio spectrum. It is for this reason that in the prior art, transistor bridge amplifiers have principally found favor as non-linear power amplifiers where the fidelity of wave-shape is of little concern.

It is therefore the principal object of the present invention to provide an improved transitsorized bridge circuit which is operable as a linear audio amplifier over a wide frequency range.

Another object of this invention is to provide an improved audio amplifier having high power output and long component life and which will operate on a comparatively low voltage power supply.

Still another object of the present invention is to provide a novel method of and improved means for converting double-ended feedback signals to single-ended feedback signals in an audio amplifier.

In its broadest aspect, the present invention relates to an audio amplifier system wherein an amplified audio signal is fed to a phase splitter, and the two resulting output signals fed to complementary portions of an improved bridge circuit utilized as a power output amplifier. Distortion is minimized through a novel feedback arrangement utilizing a difference amplifier which converts a double-ended output signal taken across the load to a single ended signal of such polarity and magnitude that it tends to correct the distortion in the amplifier when the single-ended signal is introduced to the amplification chain at an earlier stage of the system. A feature of this invention is means for assuring high gain amplifier linearity, even prior to the application of feedback. Another novel feature of this invention is the provision of safety means in the amplifier circuit to prevent self-destruction of the transistors due to transient currents or oscillations which may cause a negative collector impedance. Yet another feature of this invention is the provision of means for prevention of oscillation at high audio frequencies, thereby improving the frequency characteristics of the amplifier.

Figure 2:
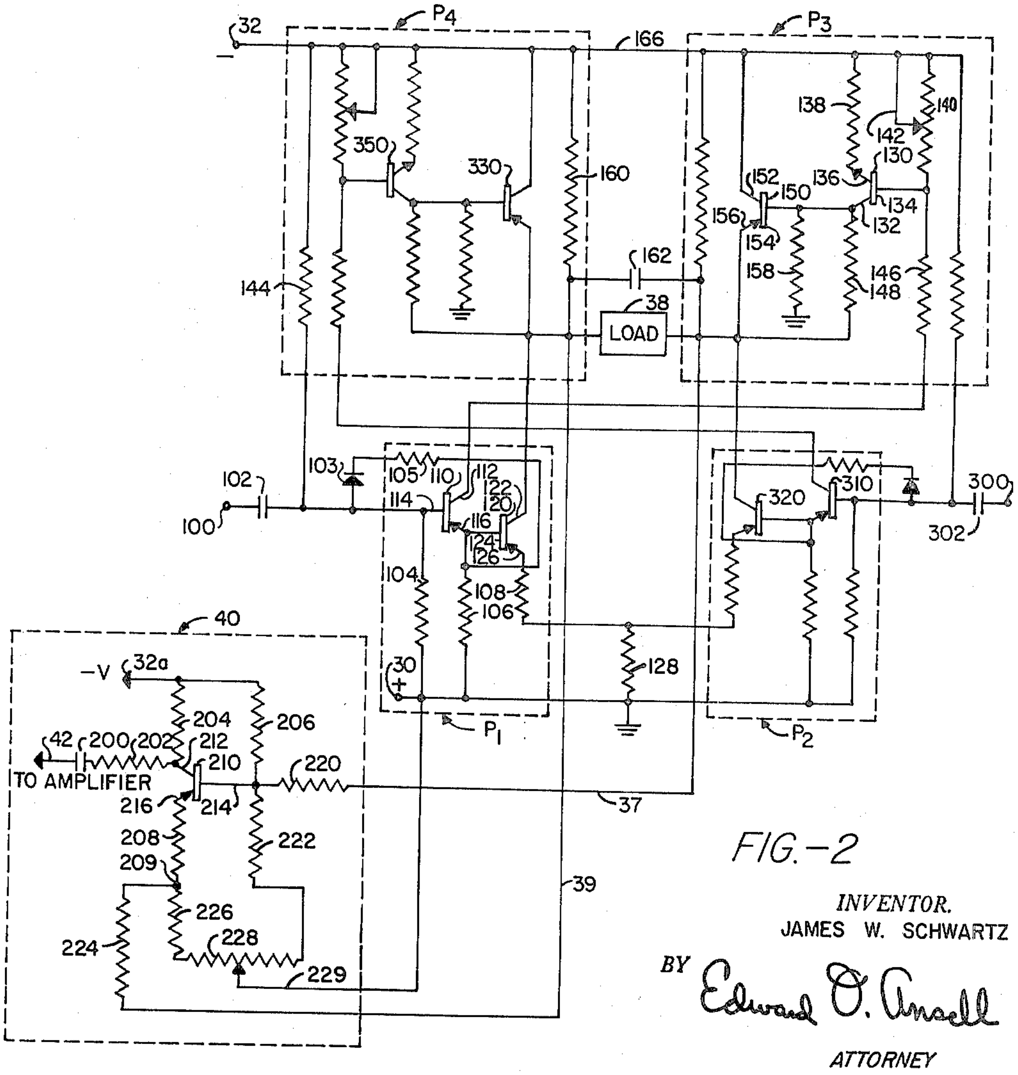

These and other objects, aspects, advantages and features of my invention will appear from the following description taken in conjunction with the accompanying drawings wherein like reference characters refer to the same or similar parts throughout the several figures, and in which:

FIG. 1 is a block diagram of an audio amplifier system utilizing the bridge type output stage and novel feedback arrangement of my invention; and FIG. 2 is an electrical schematic diagram of the bridge type power amplifier and the novel feedback arrangement utilizing an unique difference amplifier of my inveniton.

Reference is made to FIG. 1 wherein the basic arrangement of the novel audio amplifier of the present invention is shown. The input signal, which might be from a microphone, phonograph pickup, tape recorder or the like, is fed to the system input terminal 10 which connects to the preamplifier 12. Preamplifiers are well known in the art and function to amplify low-level signal voltages to an amplitude whereby they may be amplified by higher gain equipment. The amplified signal is fed from the preamplifier 12 to the preliminary amplifier 14 which is a voltage amplifier having a single-ended output, i.e., the instantaneous value of the single terminal output voltage with respect to ground varies between the voltage of the power supply and ground. This type of device is also well known in the art. The preliminary amplifier 14 is connected to a phase splitter 16, the function of which is to provide at its output both positive and negative-going signals. These signals shall be called Alpha and Beta respectively hereinafter, and are replicas of the input signal, being equal in amplitude and waveform, but of opposite polarity.

The power amplifier 20 employed in this system has four power stage units connected in a bridge arrangement. Each of the power stages 22, 24, 26, 28 respectively, hereinafter referred to as $P_1$, $P_2$, $P_3$ and $P_4$ is interconnected to the remaining units. Thus, $P_1$ is electrically connected to $P_2$, $P_3$ and $P_4$. The output load, normally a loudspeaker device or devices, is connected into the bridge circuit between the $P_1$–$P_4$ junction point 34 and the $P_2$–$P_3$ junction point 36. Such an arrangement provides a number of advantages, but principal among them is the generation of increased power output when compared to final amplifier stages of other configurations utilizing identical supply voltages and transistors of identical voltage ratings. This may readily be seen by first considering a normal single-ended amplifier stage wherein the output load is normally connected at one end to the supply voltage terminal. Depending upon the load current flow, the voltage across the load at any particular instant of time varies in value from zero to the ultimate value of the supply voltage. On the other hand, in the bridge circuit of the present invention by alternately causing stages $P_1$ and $P_3$ and then $P_2$ and $P_4$ to conduct readily, the polarity of the voltage across the load is alternately switched. While the voltage at the junction point 34 with relation to the ground point 30 might measure —V, (the negative supply voltage) and then subsequently zero, the voltage at the other load terminal 36 varies from zero to +V. The voltage across the load would then vary from —V to +V. In this manner, the peak-to-peak voltage across the load approaches twice the supply voltage (2V). This is double the voltage generated in a conventional single-ended arrangement, including complementary symmetry circuits. And, of course, the double voltage results in approximately four times the power output for a given supply voltage and load impedance.

Further advantages are enjoyed from the employment of four pairs of transistors in a bridge configuration as shown herein. If it were desired to quadruple the power from a given single-ended transistor stage, it would be necessary to double the supply voltage. This would require the use of transistors having a higher breakdown voltage rating, since the voltage across the transistor in the "off" condition would now be double the value applied in the original case. It is both difficult and expensive to fabricate high voltage transistors, and for this reason that solution is undesirable. In addition, two power transistors serially connected to form a single-ended amplifier operative on twice the supply voltage to provide a quadrupled power output, would absorb in the two power transistors the same power as is presently spread over the components of the four power transistor bridge. As a consequence, higher temperatures would be generated in the final amplifier stage which would be destructive of the transistors themselves as well as the other stage components. Since the major causes of transistor failure are high voltage and high temperatures, it is seen that the final stage shown and described is quite advantageous.

In operation, the negative-going Alpha signal will cause the $P_1$ and $P_3$ stages to assume a conductive state, the current flowing from $P_1$ through the load 38 and $P_3$ to the negative terminal 32 of the power supply. During this period the stages $P_2$–$P_4$ are in the non-conductive state. Similarly, when the Beta signal goes negative, stages $P_1$ and $P_3$ become non-conductive, and current flows through $P_2$, which now has become conductive. The flow continues through the load 38, through $P_4$, and into the negative terminal 32 of the power supply. It is seen that by this means, the current alternately flows through the load in opposite directions, thus providing a peak-to-peak swing approaching two times the supply voltage across the load.

While a transistor bridge circuit is normally non-linear over the entire dynamic range and audio spectrum, the novel driving means and feedback arrangement of the present invention serves to attenuate the distortion introduced by non-linearities in the transistors. A portion of the signal across the load 38 is fed to a difference amplifier 40 via leads 37 and 39. The signal voltages on the leads with respect to ground individually may bear little resemblance to the voltage across the load. The mathematical difference of the signals on leads 37 and 39, however is exactly the load voltage. The double-ended load voltage thus is converted by the difference amplifier 40 to a single ended signal which is of corresponding waveshape and amplitude. This difference signal is introduced to the input of the preliminary amplifier 14 via a connecting lead 42, introducing sufficient compensating distortion into the amplifier chain to attenuate the distortion brought about by the inherent non-linearities in the transistors employed in the bridge arrangement of the present invention.

The actual operation of the final amplifier stage 20 and difference amplifier 40 of the present invention can best be understood by reference to FIG. 2, a schematic diagram of the circuit arrangement. The final amplifier stage employs four pairs of transistors in a bridge circuit arrangement. Transistors are devices well known in the art, comprising a semiconductive body having a base electrode, an emitter elctrode, and a collector electrode in contact therewith. The semiconductive body may, for example, consist of a germanium or silicon crystal. The base electrode is in low resistance contact with the crystal and, for example, may be a large-area electrode. The emitter and collector electrodes are in rectifying contact with the crystal and may consist of point electrodes, line electrodes or even large-area electrodes. For operation as an amplifier, a bias in the forward direction is impressed between emitter and base while a bias voltage in the reverse direction is applied between collector and base. Assuming the crystal is of the PNP junction type, the emitter should be positive with respect to the base while the collector should be negative with respect to the base. If the crystal is of the NPN junction type the potentials must be reversed. The circuit of FIG. 2 employs both PNP and NPN transistors.

The signal input terminal 100 is adapted to receive the Alpha signal from the preceding phase-splitter stage and is connected to the base electrode 114 of the first PNP transistor 110 of the $P_1$ stage through coupling capacitor 102. A base return resistance 104 joins the base electrode 114 to the voltage terminal 30 connecting to the ground and the positive terminal of the voltage source (not shown), and a bias resistor 144 connects the base electrode 114 to the negative power terminal 32. The emitter electrode 116 is coupled to the base electrode 124 of the second PNP transistor 120 of the $P_1$ stage, the voltage at the base electrode 124 appearing across an emitter load resistor 106 which is arranged between the first emitter 116 and ground. The collector electrode 112 of the first transistor 110 connects to one side of the load 38, the other side of which connects to the collector electrode of an identical transistor in stage $P_2$. The anode of diode 103 is connected to the base electrode 114, and the cathode is connected to resistance 105 which in turn connects to the $P_{1A}$ emitter electrode 116 and the $P_{1B}$ base electrode 124. The emitter electrode 126 of the second transistor is tied to ground through an emitter linearity resistor 108 and an emitter biasing resistor 128 which is common to both stages $P_1$ and $P_2$. The collector electrode 112 of the first transistor 110 is coupled to the base electrode 134 of the first NPN transistor 130 of the third stage $P_3$ through its collector load resistor 146. The base electrode 134 is tied to the line 166 connecting to the terminal 32 joining the negative terminal of the power supply via a potentiometer 140, the slider arm 142 of which joins a position intermediate the length of the potentiometer 140 to the negative-connecting line 166. The emitter of the transistor 130 is connected to the negative line 166 through emitter resistor 138, while the collector 132 thereof connects to the load 38 through collector load resistor 148. The collector 132 of the first transistor of the $P_3$ stage is coupled to the base electrode 154 of the second PNP transistor 150 of this stage, an "off" bias resistor 158 tying the base electrode 154 to ground. The collector electrode 152 of the second transistor 150 is tied directly to line 166 which connects it with the negative terminal of the power supply, while the emitter 156 is connected to the same side of the load 38 as the collector 132 of the first transistor. A current by-pass resistor 160 ties the $P_1$ collector electrode 122 to the negative line 166, while a high frequency by-pass condenser 162 is connected in parallel with the load 38.

Inasmuch as the circuitry of stages $P_2$ and $P_4$ are identical to that of just described stages $P_1$ and $P_3$, that description will be omitted in the interest of brevity and clarity. For example, the signal input terminal 300 of stage $P_3$ is identical to the signal input terminal 100 of stage $P_1$; the coupling capacitor 302 of stage $P_3$ is identical to the coupling capacitor 102 of stage $P_1$. Similarly, transistors $P_{1A}$ and $P_{1B}$, 110 and 120 respectively are identical to transistors $P_{2A}$ and $P_{2B}$, 310 and 320; transistors $P_{3A}$ and $P_{3B}$, 130 and 150 respectively, are the same as transistors $P_{4A}$ and $P_{4B}$, 330 and 350.

In operation, negative-going Alpha and Beta signals from the phase splitter are required to alternately turn the stages $P_1$ and $P_2$ to the "on" condition. Because of the reciprocal action of the $P_1$–$P_3$ combination and the $P_2$–$P_4$ combination, only the operation of the former will be discussed in detail since the latter is an exact duplicate, one combination being in the "on" or conductive state while the other is in the "off" or non-conductive state, and vice-versa.

A negative-going Alpha signal from the phase splitter 16 is applied to the input terminal 100 and applied to base electrode 114 of the $P_1$ driver transistor 110 of the PNP type through coupling capacitor 102 which serves to remove the Direct Current component from the input signal. The voltage across base return resistor 104 is sufficiently negative to cause transistor 110 to conduct. The resulting current flow from the emitter electrode 116 through the emitter load resistor 106 causes an almost exact voltage replica of the input signal Alpha across the load resistor 106. This voltage is coupled to the base electrode 124 of the $P_{1B}$ power transistor 120 of the PNP type, causing this transistor to become conductive. An amplified current flows in the collector electrode 122 to the load 38. The presence of the emitter linearity resistor 108 is the emitter electrode circuit is to provide degeneration, thereby assuring that the current in the transistor 120 is relatively proportional to the voltage appearing on the base 124, which in turn is a close replica of the input signal to base 114. Consequently, the load current is very closely proportional to the input voltage, assuring linearity over a wide operating amplitude and frequency.

Current flow from the collector electrode 112 of transistor $P_{1A}$ goes to the negative battery terminal 32 through the collector load resistor 146 and the gain adjustment potentiometer 140. The function of the load resistor 146 is to absorb the excess collector voltage, and thereby reduce the power dissipation in the $P_{1A}$ transistor 110. The gain adjustment potentiometer 140 is actually part of the load resistance in computing the voltage gain of that transistor. Because of its small value, however, the voltage gain may be less than 1. The exact value is made adjustable by the slider arm 142, and in practice the exact value is adjusted so that the overall gain of stage $P_3$ matches that of stage $P_1$, that is, the gain of transistors 130 and 150 is made substantially equal to the gain of transistors 110 and 120.

The voltage appearing across the gain adjustment potentiometer section 140 of the load resistance drives the base electrode 134 of $P_{3A}$ driver transistor 130 positive with respect to its emitter 136. It is noted that this transistor is of the NPN type. Current flows from the emitter electrode 136 to the negative terminal 32 through the emitter resistor 138. The emitter resistor 138 is utilized rather than a direct connection in order to reflect a higher impedance as seen at the base electrode 134. It also has a degenerative effect, thereby improving the linearity of the transistor 130.

Corresponding current flow in the collector electrode 132 through the collector load resistance 148 will cause the collector to become more negative, and the transistor will experience a voltage gain. Since the collector 132 is directly coupled to the base electrode 154 of the $P_{3B}$ power transistor 150, the negative-going signal will cause transistor 150 to conduct. The emitter electrode 156 of transistor 150 is directly connected to the load, and the collector 152 connected directly to the negative current line 166.

As previously explained, when stages $P_1$ and $P_3$ are "on," stages $P_2$ and $P_4$ are in the "off" condition. When the latter stages come "on," the counterparts of the previously described components of stages $P_2$ and $P_4$ operate in a similar manner to the components of stages $P_1$ and $P_3$, described supra.

The circuitry described has a number of novel features. Initially, the $P_1$ driver transistor 110 serves the dual function of providing low impedance D.C. coupled drive signal for the $P_1$ power transistor 120, and simultaneously provides a proportional phase inverted D.C. coupled signal to $P_3$ driver transistor 130. Departures in a strictly proportional relationship between base current and collector current in $P_1$ power transistor 120 due to frequency or amplitude effects are reflected as proportional departures in the base voltage-to-collector-current relationship in the $P_1$ driver transistor 110. Departures in current gain in the $P_3$ power transistor 150 will be similar to those in $P_1$ power transistor 120. The unique coupling scheme of $P_1$ driver transistor 110 thus senses these requirements in driving $P_1$ power transistor 120 and automatically provides compensation to the signal applied to the driver of $P_3$ power transistor 150, transistor 130.

To prevent self-destruction of transistor $P_{3B}$ 150 from inordinate current rise stemming from possible negative collector impedance, "off" bias resistance 158 is connected between the base electrode 154 and ground. When transistor $P_{3A}$ is in the "off" state, this resistance causes the base electrode 154 of transistor 150 to be more positive than its emitter 156, thereby keeping the transistor solidly in the "off" condition. This is essential since conduction by $P_{3B}$ while in the "off" state, when the voltage from collector to emitter is very high, will cause the transistor to become unstable, presenting a negative collector impedance. This will cause the current to rise to a high value destroying the transistor. An additional advantage of the "off" bias resistance 158 is that it provides a path to ground for leakage currents from transistor $P_{3A}$ 130. None of the leakage current from $P_{3A}$ passes to $P_{3B}$ to turn it "on" and destroy it. The value of this "off" bias resistance is critical if it is to correctly serve its intended functions. The lower limit is a value such that unnecessary dissipation in the resistance itself is avoided, and also of a value that transistor $P_{3B}$ 150 is not biased to a value which causes $P_{3A}$ 130 difficulty in turning it on. On the other hand, the upper value is that value which is set by the amount of bias necessary to adequately protect transistor $P_{3B}$ 150, that is, to cause it to shut "off" with certainty. A voltage of approximately 0.5 volt from emitter to base is usually required.

A similar safety function is performed in the low power stage for transistors $P_{1A}$ and $P_{1B}$, 110 and 120 respectively by common emitter biasing resistance 128. When transistor $P_{1B}$ 120 is in the "off" condition it is seen that corresponding transistor $P_{2B}$, which shares this biasing resistance 128, is "on." The negative voltage appearing at the top of resistance 128 is applied to the emitter 126 of $P_{1B}$ 120. The emitter load resistance 106 completes the path, thereby tying the base electrode 124 to ground, and consequently protecting the transistors $P_{1A}$ and $P_{1B}$, insuring that they remain in the "off" condition when the $P_2$ stage 24 is "on."

It is noted that the diode 103 has its anode connected to the $P_{1A}$ base electrode 114, and the cathode connected to the base electrode 124 of the $P_{1B}$ transistor 120 through the limiting resistance 105. This circuit combination serves two important functions which are believed to be novel. First, it provides a path allowing current flow during the positive-going excursions of the input signal Alpha. This compensates for the current flow in the circuit of the base electrode 114 during negative excursions of Alpha and prevents charging of the capacitor 102 which would otherwise result in a decrease in D.C. bias at the base electrode 114 during periods of high input signal level. Changes in bias will destroy the linearity of the $P_1$ stage 22 at low instantaneous conduction levels. Proper bias balance is achieved by making resistance 105 of such a value that the diode current or positive signal swings exactly match the current in the base electrode 114 during negative signal excursions. Additionally, by returning resistance 105 to the base electrode 124 of transistor $P_{1B}$ 120, rather than to ground as has been heretofore in the prior art, supplementary "turn-off" bias is applied to $P_{1B}$ during its normal "off" periods. This further aids in preventing voltage breakdown in the transistor.

The superior operation of the novel bridge circuit of the present invention is partially due to the fact that it is possible to adjust the bias on the second transistor $P_{1B}$ so that it will go on slightly before the second transistor in the companion stage $P_{3B}$. Similarly, it is possible to slightly favor the second transistor in the second stage $P_{2B}$ so it will precede the second transistor in the fourth stage $P_{4B}$ in commencing operation. Directing our attention to the $P_1$–$P_3$ combination, when this adjustment is made, $P_{2B}$ 120 will actually see an open circuit in its collector 122 even though it is connected to the load 38. This is because transistor $P_{3B}$ 150 will be open circuited until it too goes "on." When the voltage on transistor 120 falls due to current conduction, it becomes a poor current amplifier and thereby presents a low load impedance to the emitter electrode 116 of the preceding transistor 110. This causes a large current flow in the emitter electrode 116, and consequently, a large current in the collector electrode 112. The high current flow in the collector electrode 112 circuit will immediately turn "on" transistor $P_{3A}$ 130 which immediately turns "on" transistor $P_{3B}$ 150. Consequently, both of the latter transistors will have a tendency to conduct simultaneously, which is a desired result. However, when the voltage on transistor $P_{1B}$ 120 is restored due to the completion of the circuit by conduction of transistor $P_{3B}$ 150, $P_{1B}$ ceases to draw a large current in its base circuit and it is possible for the process to reverse itself, that is, $P_{3B}$ can be restored to the "off" condition. In that instance, oscillation could easily occur, which is obviously an undesirable effect. This tendency is attenuated, however, by the presence of a current by-pass resistor which is shunted across the collector and emitter electrodes of the second transistor $P_{3B}$ of the third stage. A similar resistance 160 is placed across the collector and emitter electrodes of the second transistor of the fourth stage. The placement of the resistance 160 insures the existence of some voltage on the collector 122 of the $P_{1B}$ transistor 120 at all times. Although the presence of resistance 160 will prevent the impedance of base electrode 124 from falling to zero, and thereby prevents oscillation, it will still allow a significant lowering of the impedance of base 124 prior to conduction of transistor 150. By utilization of this resistance, the oscillation tendency has been dampened without destroying the simultaneous "turn-on" effect. The lower value of resistance 160 is determined by the dissipation in the resistance itself. Since one end of the resistance is connected to the negative line 166, and the voltage at the other end can vary from +V to —V, the dissipation may become significant. The upper limit is determined by the amount of current required to produce the damping effect. If the value is made too large, oscillation will occur because the amount of damping is inversely dependent upon the value of the resistance.

Capacitor 162 is in shunt relation with the load. The function of this capacitor is to prevent the normally low impedance of the load from rising at high frequencies. The load may consist of loudspeakers which are typically predominantly inductive. At high audio frequencies the load impedance could rise, causing oscillation. By placement of the capacitor 162 as shown, a high-frequency drop-off rather than an increase in impedance is assured. Any resonant frequency of the resulting combination is well above the audio spectrum.

The foregoing circuit arrangement eliminates the normal output transformer and provides many attendant advantages. Among them are gross savings in weight, cost, and space. Also, dispensing with the transformer eliminates resonances associated therewith which cause "ringing." Another advantage accruing from the elimination of the transformer is that phase shift problems associated with transformers are eliminated, consequently making possible wide-band feedback around the power stage in the manner to be presently described.

The novel and improved feedback arrangement of the present invention employs a difference amplifier 40 of unique construction. A portion of the output voltage across the load 38 is fed to the difference amplifier via leads 37 and 39; the voltage on lead 37 being taken from the common junction point 36 between final amplifier bridge stages $P_2$ and $P_3$, while the voltage on lead 39 being taken from the common junction point 34 between final amplifier bridge stages $P_1$ and $P_4$. The algebraic difference of these two voltages is equal to the double-ended load voltage. The difference amplifier shown here utilizes a junction transistor 210 of the PNP type although a transistor of the NPN type could be utilized if biasing voltages of opposite polarity were employed. The transistor 210 has a collector electrode 212, base electrode 214, and emitter electrode 216. The $P_2$–$P_3$ output line 37 connects to the base electrode 214 through a high impedance resistor 220 while the $P_1$–$P_4$ output line 39 connects to the transistor emitter electrode through a similar high impedance resistor 224 which is in series with an emitter coupling resistance 208. A series circuit is formed by a low impedance resistance 222, an adjustable potentiometer 228 and another resistance 226 which is of a value equal to the first low impedance resistance 222, and this series chain is connected between the base electrode 214 and the junction 209 between the high impedance resistor 224 and the emitter coupling resistor 208. The divider arm 229 of the potentiometer 228 connects to the positive terminal 30 of the voltage supply. A biasing resistance 206 is placed between the base electrode 214 and the negative terminal of the voltage supply **32*a* while a collector load resistor 204 connects the collector electrode 212 to the negative terminal 32*a*. The single-ended output signal from the difference amplifier stage 40 appears on the output line 42 which is connected to the collector electrode through output coupling capacitor 200 and output coupling resistor 202**.

In operation, the two output signals are fed to the stage via the input leads 37, 39. Thus, each side of the final amplifier output signal appears across a voltage divider comprising a high impedance and low impedance resistor in series with a variable potentiometer 228 set very close to its center, the divider arm of which 229 connects to the positive terminal 30 of the voltage supply, which may be regarded as the reference level as it is at ground potential. For the output signal appearing on the $P_2$–$P_3$ lead 37, the divider comprises high impedance resistance 220, low impedance resistance 222, half of potentiometer 228 to ground. For the output signal appearing on the $P_1$–$P_4$ lead 39, the divider comprises high impedance resistance 224, low impedance resistance 226, half of potentiometer 228, to ground.

With regard to the $P_2$–$P_3$ output signal which is fed to the base electrode 214, the base electrode presents a relatively high impedance to the junction of the high impedance resistor 220 and the low impedance resistor 222, thus establishing a signal voltage at the base electrode which is essentially equal to $$(R_{222}+\tfrac{1}{2}R_{228})/(R_{220}+R_{222}+\tfrac{1}{2}R_{228})$$

times the voltage from junction 36 to ground. The final amplifier output signal appearing at the opposite side of the load 38 at the junction of $P_1$–$P_4$, and brought to this stage via lead 39, is coupled to the emitter electrode 216 through a similar voltage divider resistance network 224, 226, 228. Normally, the emitter electrode 216 would present a relatively low impedance, and consequently, direct connection of the signal to emitter electrode 216 from junction 209 would alter the voltage division ratio. Because of the nature of the operation of the difference amplifier 40, it is essential that the base and emitter voltage division ratios be substantially equal. Although this could be accomplished for a particular circuit wherein direct connection from the junction point 209 of the divider to the emitter electrode was employed by adjustment of the values in the emitter divider circuit 224, 226, 228 to get the same voltage division as in the base circuit, this would require an individual design for each unit constructed because of variations from one transistor to another. Also, changes in transistor operating characteristics due to passage of time, variations in operating level and other factors would require continual readjustment. It is thus a novel feature of my invention to provide an emitter coupling resistor 208 which connects the emitter electrode 216 to the junction point 209 of the emitter voltage divider circuit. This resistance is of relatively high impedance, and assures that the signal voltage appearing at the emitter electrode 216 is substantially equal to the signal voltage appearing at the base electrode 214. Since the emitter electrode now presents a high impedance to the junction 209, the voltage appearing at the emitter is now equal to $$(R_{226}+\tfrac{1}{2}R_{228})/(R_{224}+R_{226}+\tfrac{1}{2}R_{228})$$

times the voltage from junction 34 to ground. Since $R_{226}$ is equal to $R_{222}$, and $R_{220}$ is equal to $R_{224}$, it is seen that the base and emitter signal attenuation signal dividers are now equal.

Additionally, the provision of the high impedance emitter resistance 208 causes a relatively high emitter output impedance which in turn is reflected in a high base input impedance. As a result, the base division ratio is preserved and additionally, variations in transistor parameters from unit to unit assume little significance.

The function of the potentiometer 228 is to adjust for minor differences in the actual values in the identical resistances in the two voltage divider circuits and in varying transistor parameters. It has been found that the potentiometer provides means of balancing the two circuits to within a fraction of 1 percent of each other.

A typical set of values for the novel difference amplifier stage 40 is set forth below, although it is to be understood that these parameters are given by way of example and not of limitation, and other combinations of components could be arranged to provide a device which would perform equally well.

| | |
|---|---|
| $C_{200}$—4 microfarads | $R_{220}$—3,600 ohms |
| $R_{202}$—47,000 ohms | $R_{222}$—47 ohms |
| $R_{204}$—10,000 ohms | $R_{224}$—3,600 ohms |
| $R_{206}$—1,000 ohms | $R_{226}$—47 ohms |
| $R_{208}$—1,000 ohms | $R_{228}$—25 ohms |
| $T_{210}$—2N591 | |

It is thus seen that in operation a signal voltage proportional to that at junction 36 is fed to the base electrode 214 and a signal voltage proportional to that at junction 34 is fed to the emitter electrode 216. The difference of these two voltages causes a proportional current flow in the collector electrode 212. What has been described, therefore, is a highly effective single transistor circuit for transforming a double-ended signal to a single-ended difference signal for utilization in the feedback arrangement of the audio amplifier of the present invention to attenuate distortion therein.

It is to be understood that the form of the invention herewith shown and described is to be taken as the preferred example of the same, and that various changes in the configuration, arrangement, or connection of the parts may be resorted to, without departing from the spirit of this invention or the scope of the claims.

What is claimed is:

1. An audio amplifier system comprising: a preliminary amplifier stage capable of generating an output signal voltage which varies in amplitude between ground and the value of the power supply voltage; a phase splitter stage connected to the output of said preliminary amplifier stage, said phase splitter stage converting the output signal voltage from said preliminary amplifier stage to a first signal voltage of one polarity and a second signal voltage of equal amplitude and identical wave-shape but of opposite polarity; a power output amplifier connected to the outputs of said phase-splitter stage, said power amplifier having four stages connected in bridge arrangement, two sections of which are adapted to be responsive to said first signal voltages of one polarity, and two sections of which are adapted to be responsive to said second signal voltages of opposite polarity; means for connecting an output load to said power amplifier stage whereby the peak-to-peak signal voltage across said load will approach a value of double the power supply voltage to said power amplifier stage; and a difference amplifier, the input of which is connected to said output load connection means, and the output of which is fed to the input of said preliminary amplifier stage.

2. An audio amplifier system comprising: signal amplification means; means for converting the output signal voltage from said signal amplification means to a pair of signal voltages of identical wave shape and amplitude but of opposite polarities; a power amplifier stage connected to said signal conversion means, said power amplifier having four stages connected in bridge arrangement, two sections of which are adapted to be responsive to said signal voltage from said conversion means of one polarity, and two sections of which are adapted to be responsive to said signal voltage from said conversion means of an opposite polarity; means for connecting an output load to said power amplifier stage whereby the peak-to-peak signal voltage across said load will approach a value of twice the power supply voltage to said power amplifier stage; means connected to said load connection means for converting the peak-to-peak voltage appearing across the load to a signal voltage which is identical in wave form but of amplitude and polarity equal to the difference in instantaneous value of the voltages appearing at both ends of the load; and means for introducing this difference voltage to the input of said signal amplification means.

3. An audio amplifier comprising a first and second audio unit, said first and second audio unit connected in bridge arrangement and adapted to connect to an output load, said units comprising: first, second and third transistors of one polarity and a fourth transistor of opposite polarity, said transistors each having base, collector, and emitter electrodes; means for coupling an input signal to the base electrode of said first transistor; said first emitter electrode being connected to said second transistor base electrode; first resistance means connecting said first base electrode to ground; second resistance means connecting said first emitter electrode to ground; a third resistance; said first collector electrode being connected to said fourth transistor base electrode through said third resistance; a fourth resistance connecting said collector electrode of said fourth transistor to said emitter electrode of said third transistor; resistance means connecting the emitter electrode of said second transistor to ground; means for connecting said output load between said emitter electrode of said third transistor and said collector electrode of said second transistor; said third transistor emitter electrode being connected to said load connection means; means connecting the base electrode of said third transistor to the collector electrode of said fourth transistor; means for connecting a supply voltage source to said third transistor collector electrode; resistance means connecting the base electrode of said third transistor to ground; resistance means connecting said fourth transistor emitter electrode and said voltage source connecting means; potentiometer means connecting said fourth transistor base electrode and said voltage source connecting means; resistance means connecting said voltage source connecting means and the base electrode of said first transistor; and a capacitor connected in shunt arrangement across said load.

4. A device as described in claim 3, and in addition: a diode having an anode and a cathode; a current limiting resistance; said diode anode being connected to said first transistor base electrode; said diode cathode being connected to said limiting resistance; and said limiting resistance being connected to said second transistor base electrode.

References Cited by the Examiner

UNITED STATES PATENTS 3,050,688 8/62 Heyser ---------------- 330—24

ROY LAKE, *Primary Examiner.*

JOHN KOMINSKI, *Examiner.*